United States Patent [19]
Underhill

[11] 3,852,681
[45] Dec. 3, 1974

[54] VARIABLE FREQUENCY OSCILLATOR SYSTEMS

[75] Inventor: Michael James Underhill, Salfords, near Redhill, England

[73] Assignee: U.S. Philips Corporation, New York, N.Y.

[22] Filed: Sept. 28, 1972

[21] Appl. No.: 293,122

[30] Foreign Application Priority Data

Oct. 1, 1971 Great Britain .................... 45815/71

[52] U.S. Cl. .................... 331/1 R, 331/10, 331/17, 331/172, 331/179
[51] Int. Cl. .................... H03b 3/04
[58] Field of Search ............. 331/1, 10, 25, 107, 17, 331/172; 307/225, 221

[56] References Cited

UNITED STATES PATENTS

| | | | |
|---|---|---|---|
| 2,991,354 | 7/1961 | Crafts | 331/1 |
| 3,083,340 | 3/1963 | Nelson | 331/1 |
| 3,289,096 | 11/1966 | Longuemare, Jr. et al. | 331/1 |
| 3,395,360 | 7/1968 | Smeulers | 331/10 |
| 3,413,565 | 11/1968 | Babany et al. | 331/25 |
| 3,568,102 | 3/1971 | Tseng | 331/107 |
| 3,657,658 | 4/1972 | Kubo | 307/225 R |
| 3,694,776 | 9/1972 | Linder | 331/17 |

FOREIGN PATENTS OR APPLICATIONS

| | | | |
|---|---|---|---|
| 128,498 | 0/1960 | U.S.S.R. | 331/1 |

*Primary Examiner*—John Kominski
*Attorney, Agent, or Firm*—Frank R. Trifari; Henry I. Steckler

[57] ABSTRACT

The output of an oscillator is fed into a delay line and the phase difference across the delay line is compared in a comparator which gives a d.c. signal. This d.c. signal is fed back to control the oscillator. The oscillator will normally sit at one of a number of locking frequencies spaced apart so that the delay line gives a zero phase difference but by applying a compensating d.c. signal the oscillator can be set to any intermediate frequency. A square wave pulse is used to cause the oscillator to jump in frequency to the next locking frequency.

6 Claims, 6 Drawing Figures

VARIABLE FREQUENCY OSCILLATOR SYSTEMS

The present invention relates to improvements in or relating to Variable Frequency Oscillator System (to be hereinafter referred to as V.F.O. systems) and more particularly to V.F.O. Systems including a delay line.

According to the present invention there is provided a V.F.O. system including a variable frequency oscillator, a delay line, the input of which is derived from the output of the variable frequency oscillator, a phase detector connected across the acoustic delay line, and means for applying the output of the phase detector to the variable frequency oscillator to control its frequency.

Figure 1:
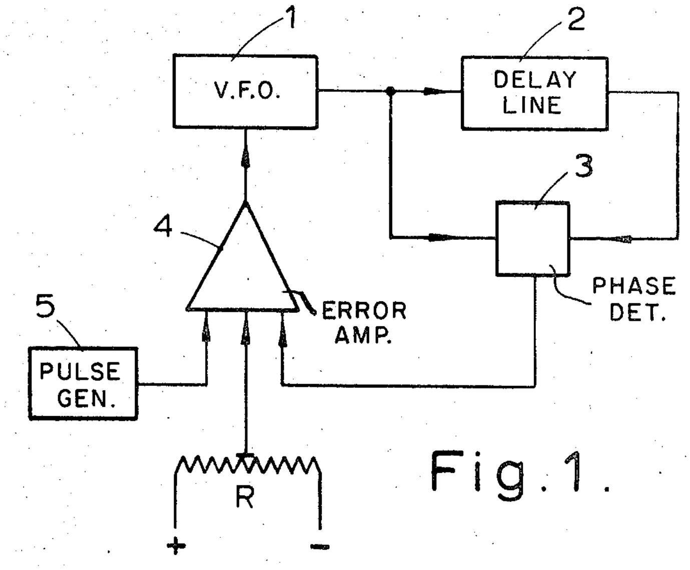
Figure 2:
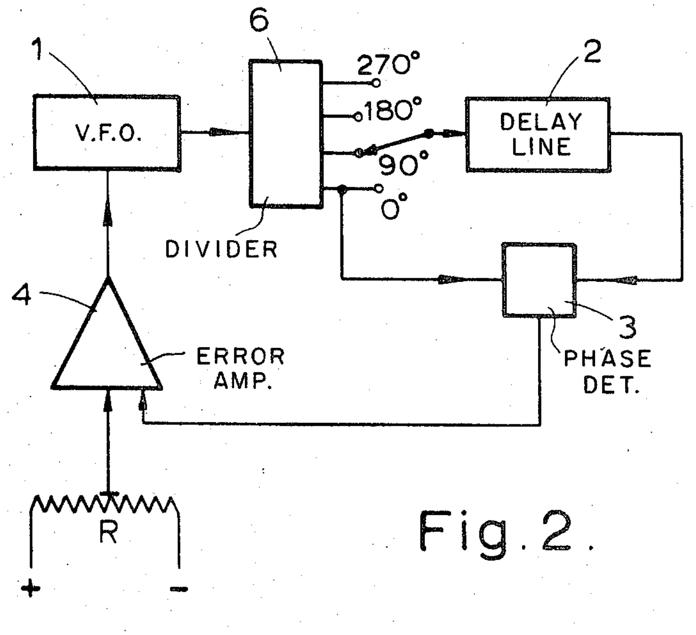
Figure 3:
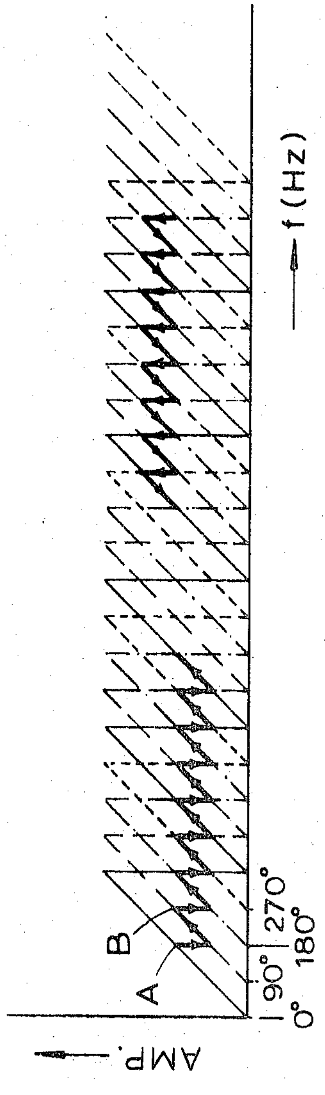
Figure 4:
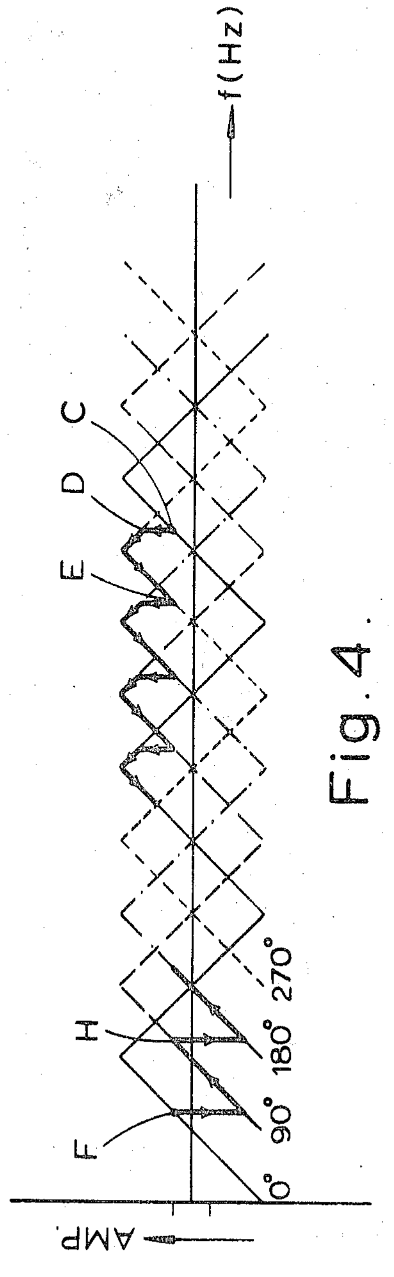
Figure 5:
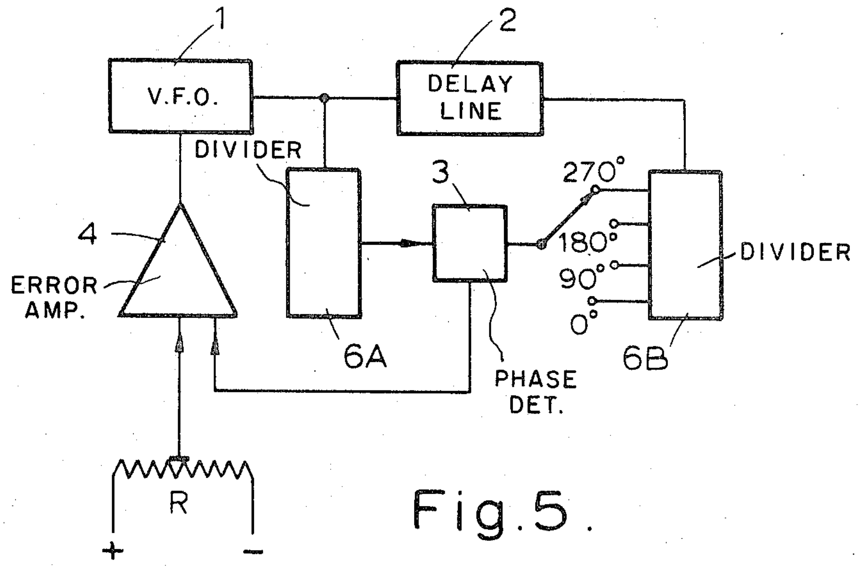
Figure 6:
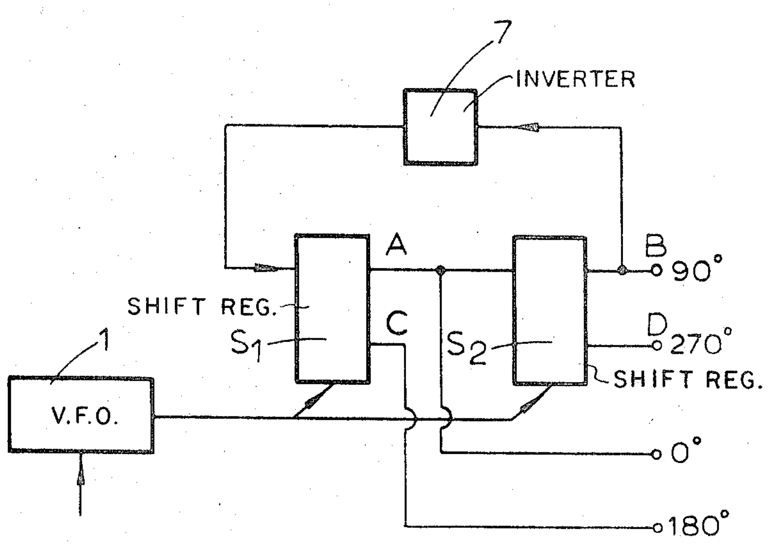

Embodiments of the present invention will now be described by way of example with reference to the accompanying drawings in which:

FIG. 1 shows diagrammatically a V.F.O. system according to the present invention, FIG. 2 shows a modification of the V.F.O. system shown in FIG. 1, FIGS. 3 and 4 show characteristics used to explain the operation of FIG. 2, FIG. 5 shows a further modification of the V.F.O. system shown in FIG. 1, FIG. 6 shows in greater detail a divider for use in the V.F.O. systems of FIG. 2 or FIG. 5.

Referring now to FIG. 1, there is shown a Variable Frequency Oscillator (V.F.O.)1 the output of which is fed to an acoustic delay line 2 and to one input of a linear phase detector 3. The output of the acoustic delay line 2 is fed to the second input of the phase detector 3 so that phase detector 3 detects any differences in phase between the signal at either end of the acoustic delay line 2.

The output of the phase detector 3 is fed to one input of an error detector and amplifier 4. A variable resistance R is connected with its slider as a second input to the error amplifier 4 and with its end terminals connected to respective positive and negative voltages. The third input to the error amplifier 4 is connected to a pulse generator 5 which can supply positive or negative pulses. The output of the error amplifier 4 is used to control the frequency of the V.F.O. 1.

In operation, when the apparatus is switched on the V.F.O. frequency will increase until it reaches the range in which the acoustic delay line 2 is operative. At a certain frequency the output of the delay line 2 will be in phase with the input and therefore the output of the linear phase detector 3 will be zero. If the slider of R is set to give zero volts and the output of the pulse generator 5 is zero then the output of the error amplifier 4 will also be zero and the V.F.O. will stabilise on this voltage. Depending upon the delay period the V.F.O. will have a series equidistantly spaced of locking frequencies - e.g. for a delay time of 100 $\mu$Sec the locking frequencies will be 10KHz apart. The V.F.O. cannot lock on an intermediate frequency because the control loop is set so that the oscillator is forced to lock on to one of the adjacent locking frequencies.

In order to set the V.F.O. frequency to an intermediate frequency between the locking points an error can be introduced by re-setting the slider on the variable resistance R to balance out the resultant output of the linear phase detector 3. The resistor R can only be used however to alter the frequency of the V.F.O. between two adjacent locking frequencies. In order to "jump" between locking frequencies a pulse is generated by the pulse generator 5, for example, positive for an increase in frequency and negative for a decrease in frequency.

In practice the resistor R will not give control of the frequency of the V.F.O. over the whole, 360° phase difference, range between adjacent locking points i.e. over the whole 10KHz in the example given above. This is because at the extremities of the 360° phase difference the phase detector 3 is not very stable over for example the 0°–60° and 300°–360° portion of the range. The circuit of FIG. 2 overcomes this disadvantage.

In FIG. 2, the pulse generator 5 is omitted and the output of the V.F.O. is fed into a divide by four circuit 6. A suitable divider circuit is described hereinafer with reference to FIG. 6. The inputs to the phase detector 3 are taken from the output of the delay line and from the first (0°) output of the divider 6. Thus the frequency of the V.F.O. is equal to four times the frequency passed through the delay line. Thus by choice of the divisor the V.F.O. can be run at any practical frequency greater than the lowest frequency that can be passed by the delay line whilst using the same acoustic delay line. It is also obvious that by the use of a multiplier instead of a divider the V.C.O. can be run at a lower frequency than the delay line. By using a binary rate multiplier the frequency can be multiplied or divided by other than whole numbers.

By choosing the output switch position S to 0°, 90°, 180° or 270° the extremities of the phase detectors range i.e. 0°–60° and 300°–360° need not be utilised since before these ranges are reached the switch S is reset to a new position. This is further explained with reference to FIGS. 3 and 4.

FIG. 3 shows one amplitude-frequency characteristic for the phase detector 3 in which as to the phase difference between the inputs increases from 0°–360° the output of the phase detector rises from a maximum negative value to a maximum positive value. The four separate phase characteristics are drawn in FIG. 3, and the optimum operating range for the phase detector is shown. If we assume that the resistor R is set so that with the switch S set at 0° the frequency is such that the phase detector gives a zero output at point A. The frequency can, of course be altered by adjusting R and the frequency will follow the characteristic shown to equalise the offset value of R.

If from the point A the switch S is re-set to the 90° position the phase error will be positive and the frequency will change as shown by the arrowed line on the left hand end of FIG. 3. By rotating the switch S in a continuous manner the frequency can be made to jump up as shown or to be reduced in steps as shown in the right of FIG. 3 providing that a sufficient time is allowed between each switch movement for the control loop to stabilise. Thus the connection of the pulse generator 5 as in FIG. 1 is now unnecessary.

FIG. 4 shows a characteristic for a second type of phase detector in which from 0°–180° phase difference the output rises from e.g. 0 volts to a maximum positive voltage and from 180°–360° the output falls along a similar but reverse path. In rotating the swtich S from 0°–90° and from 90°–180° the frequency increases from F to H as for the phase detector of FIG. 3.

However when decreasing the frequency by rotating the switch S from 0°–270° and from 270°–180° etc. the frequency follows the path shown on the right of FIG.

4 from C–D. At point D a +*ve* error is present at the input of the error amplifier 4. This error in effect indicates to the V.F.O. that the frequency is too high and the frequency of the V.F.O. will therefore be lowered to point E even though in the process the error initially increases.

Referring now to FIG. 5, where for any reason it is difficult to provide a V.C.O. to run at a high frequency as in FIG. 2 and where the phase discriminator still functions better at a lower frequency the division can be made in the input leads to the phase discriminator. In this case it is necessary to provide two dividers 6A and 6B, the first input to the discriminator being taken from a fixed output from 6A and the second input from a switch S' connected as shown to 6B. The circuit functions in a similar manner to FIG. 2. The switches S and S' will in practice normally be electronic.

A suitable divider for both FIG. 2 and FIG. 5 is shown in FIG. 6. This consists of two shift register stages S1 and S2 connected in series, one output of S2 being connected to the input of S1, the frequency to be divided being used as the shifting or clock pulse. This type of shift register is known as a Switched Tail Ring counter and the 0°, 90°, 180° and 270° outputs are obtained from the points marked in FIG. 5, as explained by the following table.

| | $t_0$ | $t_1$ | $t_2$ | $t_3$ | $t_4$ | $t_5$ |
|---|---|---|---|---|---|---|
| A | 0 | 1 | 1 | 0 | | |
| B | 0 | 0 | 1 | 1 | | |
| | | | | | etc. | |
| C | 1 | 0 | 0 | 1 | | |
| D | 1 | 1 | 0 | 0 | | |

where $t_0$, $t_1$, $t_2$, $t_3$ are instances of time separated by single complete cycles of the frequency of the V.F.O.

With the arrangement of FIG. 5 it is possible to jump in frequency up or down as in FIGS. 3 and 4 by the deletion of a cycle from divider 6A or 6B respectively. If switch S' is set to the 0° position then if one of the cycles i.e. 0°, 90°, 180° or 270° is removed the count will effectively be delayed by one cycle of the V.F.O. The phase detector 3 will therefore give an output to compensate for the resultant imbalance at its input and this as explained with FIG. 3 will cause the frequency to increase. The system will then stabilise on to a different higher frequency. Removal of a further cycle will cause the frequency to jump again.

In order to decrease the frequency a cycle can be removed from the divider 6A so that the phase discriminator 3 will receive the opposite imbalance and will lower the frequency to compensate. Removal of cycles can be obtained by an inhibit gating system which is set in response to an external command to remove one cycle of e.g. the V.C.O. output and to be reset thereafter.

In a practical embodiment an acoustic delay line was used from the P.A.L. colour television system (Mullard reference DL 40) as this was readily available.

This gives a delay of 63.943 μSec and results in locking points which are theoretically 15.6389 KHz apart. In practice due to circuit delays the locking points were found to be 15.623 KHz apart. Other types of delay line could be used, the choice being determined normally by the frequency range of the V.F.O. The acoustic delay line has the advantage however that it is readily obtainable at low price and that the frequency through the delay line is compatible with transistor technology.

The bandwidth of the Mullard DL 40 acoustic delay line at a 3dB loss is 3.43 – 5.23 MHz and on initial switch on, the V.F.O. system will lock on to a frequency in this range or in a range dictated by the multiplying factors used.

In practice in order to compensate for the 3dB loss through the delay a limiting amplifier may be used at the output of the delay line so that the phase discriminator has equal signals to compare.

I claim:

1. A circuit comprising a variable frequency oscillator having a frequency control input and an output; a phase detector having a first input means for receiving a signal in accordance with said oscillator output, a second input, and an output coupled to said frequency control input; a series circuit having an input coupled to said oscillator output and an output coupled to said detector second input, said series circuit comprising a frequency converter having a plurality of output means for providing output signals of different phases, switching means coupled to said converter outputs for selecting one of said output signals and a means for delaying signals coupled to said converter.

2. A circuit as claimed in claim 1 wherein said converter is directly coupled to said oscillator output, a given one of said converter outputs is coupled to said detector first input, said switching means being coupled to said detector second input.

3. A circuit as claimed in claim 1 wherein said delaying means is directly coupled to said oscillator output, and further comprising a second frequency converter circuit coupled between said oscillator output and said detector first input.

4. A circuit as claimed in claim 1 wherein said converter comprises two serial coupled shift registers the output of the second register being coupled to the input of the first register, each of said registers comprising clock pulse inputs which comprise an input means for said conveter, and outputs which comprise output means for said converter.

5. A circuit as claimed in claim 1 wherein said converter comprises a frequency divider.

6. A circuit as claimed in claim 1 wherein said converter comprises a frequency multiplier.

* * * * *